United States Patent
Freytag

(10) Patent No.: US 9,817,096 B2
(45) Date of Patent: Nov. 14, 2017

(54) ACTIVELY SHIELDED, CYLINDRICAL GRADIENT COIL SYSTEM WITH PASSIVE RF SHIELDING FOR NMR DEVICES

(71) Applicant: BRUKER BIOSPIN AG, Faellanden (CH)

(72) Inventor: Nicolas Freytag, Binz (CH)

(73) Assignee: Bruker BioSpin AG, Faellanden (CH)

( * ) Notice: Subject to any disclaimer, the term of this patent is extended or adjusted under 35 U.S.C. 154(b) by 912 days.

(21) Appl. No.: 14/217,557

(22) Filed: Mar. 18, 2014

(65) Prior Publication Data
US 2014/0285201 A1    Sep. 25, 2014

(30) Foreign Application Priority Data
Mar. 20, 2013  (DE) .......................... 10 2013 204 952

(51) Int. Cl.
*G01R 33/421*    (2006.01)
*G01R 33/385*    (2006.01)

(52) U.S. Cl.
CPC ...... *G01R 33/4215* (2013.01); *G01R 33/3858* (2013.01)

(58) Field of Classification Search
CPC .......................... G01R 33/4215; G01R 33/3858
See application file for complete search history.

(56) References Cited

U.S. PATENT DOCUMENTS

| 4,733,189 A | 3/1988 | Punchard |
| 5,296,810 A | 3/1994 | Morich |
| 5,406,204 A | 4/1995 | Morich |
| 5,431,164 A * | 7/1995 | Westphal ............. G01R 33/385 324/307 |
| 5,512,828 A | 4/1996 | Pausch |
| 5,576,623 A * | 11/1996 | Muller ................. G01R 33/385 324/318 |
| 5,600,245 A | 2/1997 | Yamamoto |
| 5,939,882 A | 8/1999 | Gebhardt |
| RE36,881 E * | 9/2000 | Muller ................. G01R 33/385 324/318 |
| 6,154,110 A | 11/2000 | Takeshima |
| 6,456,076 B1 | 9/2002 | Joseph |

(Continued)

FOREIGN PATENT DOCUMENTS

| JP | 2002200055 | 7/2002 |
| JP | 2004267405 | 9/2004 |

(Continued)

*Primary Examiner* — Dixomara Vargas
(74) *Attorney, Agent, or Firm* — Paul Vincent

(57) ABSTRACT

A gradient coil system has a cylindrical section in a central region, which contains no conductor elements and has a maximum outer radius that is larger than a minimum inner radius of conductor elements of a main gradient coil. An outer radius of this cylindrical section is only insubstantially smaller or equal in size to a minimum inner radius of a shielding coil in this axial range. The free space in the center of the gradient coil system is used to insert a passive RF shield, whose radius in a central region becomes larger over a certain length than its radius in outer regions. The RF shield is constructed from at least three partial sections, which are electrically interconnected. The actively shielded gradient coil system maximizes the volume of the RF region without loss of gradient coil system performance.

18 Claims, 3 Drawing Sheets

(56) References Cited

U.S. PATENT DOCUMENTS

| | | | |
|---|---|---|---|
| 6,933,723 B2 | 8/2005 | Schulz | |
| 7,057,391 B1 | 6/2006 | Tanabe | |
| 7,109,712 B2 | 9/2006 | Boskamp | |
| 7,141,974 B2 * | 11/2006 | Edelstein | G01R 33/4215 324/318 |
| 7,375,526 B2 * | 5/2008 | Edelstein | G01R 33/3854 324/307 |
| 7,852,083 B2 | 12/2010 | Yatsuo | |
| 8,487,269 B2 * | 7/2013 | Amies | A61N 5/1049 250/396 ML |
| 8,514,043 B2 * | 8/2013 | Wang | G01R 33/421 335/301 |
| 8,754,644 B2 * | 6/2014 | Trakic | G01R 33/5659 324/307 |
| 8,903,471 B2 * | 12/2014 | Heid | A61N 5/1049 378/65 |
| 8,958,864 B2 * | 2/2015 | Amies | A61N 5/1049 600/411 |
| 9,421,398 B2 * | 8/2016 | Shvartsman | G01R 33/3806 |
| 9,526,918 B2 * | 12/2016 | Kruip | A61N 5/1049 |
| 2005/0073311 A1 | 4/2005 | Nistler | |
| 2005/0099183 A1 | 5/2005 | Heid | |
| 2006/0279281 A1 | 12/2006 | Rapoport | |
| 2009/0073738 A1 | 3/2009 | Lenssen | |
| 2009/0173568 A1 | 7/2009 | Kassner | |
| 2011/0012593 A1 | 1/2011 | Shvartsman | |
| 2011/0175616 A1 | 7/2011 | Ochi | |

FOREIGN PATENT DOCUMENTS

| | | |
|---|---|---|
| JP | 2005160842 | 6/2005 |
| JP | 2008253593 | 10/2008 |
| WO | WO 2007/109426 | 9/2007 |

\* cited by examiner

ACTIVELY SHIELDED, CYLINDRICAL GRADIENT COIL SYSTEM WITH PASSIVE RF SHIELDING FOR NMR DEVICES

This application claims Paris convention priority from DE 10 2013 204 952.8 filed Mar. 20, 2013, the entire disclosure of which is hereby incorporated by reference.

BACKGROUND OF THE INVENTION

The invention relates to an actively shielded, cylindrical gradient coil system for use in an MR (=magnetic resonance) spectrometer with a main field magnet, which generates a main magnetic field aligned in the direction of a z-axis, wherein, when current flows in one of the measurement volumes through which the z-axis passes, the gradient coil system generates a Z-gradient field, whose passage through zero is located at the center of the measurement volume, and wherein the gradient coil system has at least one main gradient coil and at least one active shielding coil, wherein the main gradient coil is constructed from at least two cylindrical partial coil systems axially spaced from one another in the z-direction by a length L1 and symmetrically with respect to the center of the measurement volume, the axes of said cylindrical partial coil systems extending collinearly with the z-axis, wherein the cylindrical partial coil systems are at least partially constructed from electrical conductor sections wound with a maximum outer radius $R1gradient_{out}^{max}$ around the z-axis, wherein at least one of the active shielding coils is constructed from electrical conductors on a minimum inner radius $R1shield_{in}^{min}$ around the z-axis, and wherein $R/shie/d_{in}^{min} > R1gradient_{out}^{max}$. Such a gradient coil system for an imaging NMR apparatus is disclosed for example by U.S. Pat. No. 5,296,810.

A modern nuclear magnetic resonance (NMR) spectrometer consists of an electromagnet for generating a strong, static magnetic field, a shim system for homogenizing the static magnetic field and an NMR probe, comprising at least one transmit and/or receive coil system for transmitting RF pulses and receiving the signals, a measurement sample, and a gradient coil system for generating pulsed field gradients. Moreover, the NMR spectrometer comprises the necessary apparatus for generating and detecting electrical signals, which are generated and/or detected in the aforementioned components.

Most modern NMR probes contain actively shielded gradient coil systems for generating a Z-gradient field, in rare cases additionally for generating X-, Y-, and Z-gradient fields. The active shielding is necessary because many NMR pulse sequences require fast switching of the gradient fields, which, in the case of unshielded gradient coil systems, results in induction of eddy currents in the surrounding metallic structures (in particular, in the outer casing of the probes, the former for the shim system, and the various metallic elements of the superconductive magnet systems, some of which are cryogenically cooled, and the cryogenic shim systems). The objective of active shielding is to reduce eddy currents to a minimum and to reduce the measurement artifacts that are caused by the remaining eddy currents in the measurement volume. These measurement artifacts are grouped under the term "recovery characteristics" of the gradient coil system and comprise both phase and amplitude errors of the NMR lines to be received.

In the prior art, actively shielded gradient coil systems are usually manufactured in such a way that the turns of the gradient coils and the associated shielding coils are located at two different radii for each gradient. The turns on the inner radius are used for generating the gradient field while the outer radius is responsible for shielding the gradient fields toward the outside. In some cases, certain linearization tasks can be performed by the turns on the outer diameter and part of the shielding is located in the outermost axial regions of the inner cylinder.

This design principle offers great advantages in the manufacturing and calculation of gradient coils. In particular, manufacturing is simplified because when constructing gradient coils from cut electrically conductive tubes, foils, metal sheets, PCB material, or coating and structuring on cylindrical substrates, only two tube-shaped objects have to be aligned with each other in each case. In the case of multiple-layered gradient coils, additional radial and axial positioning has to be performed, which usually reduces the yield during manufacturing.

In particular, in Z-gradient systems, it is possible to choose a design for the gradient in which the distribution of the electrical conductors of the main gradient coil exhibits axial spacing, symmetrically with respect to the center of the measurement volume. Depending on the conceptual design, this can also be applied to active gradient shielding. Examples of the allocation of such gradients are provided in, for example, U.S. Pat. No. 4,733,189.

The turns of the gradients are usually connected in series, to be able to ensure a constant current through all conductors. Parallel connections would result in fluctuations of the gradient field by the variation of the currents of different partial coils, in particular, when the temperatures of the individual conductors vary during operation due to inhomogeneous cooling, differing conductor lengths, and the resulting resistances, etc. However, parallel connections are also used in practice, which demand greater effort in the generation and regulation of the gradient currents. The usual way of making an electrical connection between the two symmetrical halves of the main gradient coil and the active shielding coil is to route them through the central region in which they are spaced, wherein the conductor for connection can extend either coaxially with the cylinder axis or along any curve. Examples of curved profiles are provided in U.S. Pat. No. 7,109,712 B2 or in U.S. Pat. No. 6,456,076 B1.

Examples of straight profiles are given, for example, in U.S. Pat. No. 5,296,810 cited in the introduction or in U.S. Pat. No. 6,456,076 B1 or in U.S. Pat. No. 7,109,712 B2, documents cited as prior art.

Besides the tube-shaped gradient coil system, the prior art also comprises other geometries in which the turns of the main and/or shielding gradient coils are located on surfaces that are more complex:

U.S. Pat. No. 5,512,828 discloses gradients that consist of one main gradient coil and one active shielding coil, wherein the distance between the two coils is greater in the regions further from the center than in the regions near the center.

U.S. Pat. No. 5,939,882 discloses a gradient coil system in which the gradient coils do not occupy the entire space. However, this is a modification of a biplanar gradient coil system on curved surfaces and not a cylindrical gradient coil system. In the region of the RF coils, occupancy of the space by gradient coils is provided at least for part of the xy-plane.

U.S. Pat. No. 6,933,723 B2 discloses a gradient coil system in which the main gradient coil is relocated in the region of the RF coil. Herein, 218/221 represent the symmetry axes x and z, 211 the magnet for generating a static magnetic field, 212 the active shielding coil of the gradient coil system, 213/213' the main gradient coil of the gradient coil system, and 219 the RF coil. Since neither the description nor the illustrations describe an RF shielding for limiting the volume accessible to the RF system, it must be assumed that there is no RF shielding in this configuration.

The same is disclosed in U.S. Pat. No. 7,852,083 B2; here, however, RF shielding is explicitly described, which gives the RF coil system a larger volume due to the set back part of the main gradient coil and thus increases the performance of the RF coil system (or permits a greater distance between the gradient coil and the shielding coil for the gradient in the region outside the central region and thus improves the efficiency of the gradient coils as compared with a conventional gradient coil system). The RF shielding is provided in the form of a main gradient coil, which, in the region of the RF coils, has a larger radius r2>r1 than outside the active RF region.

Common to both documents, U.S. Pat. No. 7,852,083 B2 and U.S. Pat. No. 6,933,723 B2, is the fact that the gradient coils each extend along the full length of the z-axis or even have an overlapping region in which turns of the gradient coils exist on two radii. There is no axial region, in which the main gradient coils have no turns.

U.S. Pat. No. 7,057,391 B1 discloses a magnet system with integrated gradients (3) and an RF coil (4), in which the gradient and the coil are set into a recess in the magnet. Here, the aim is to utilize the "unused" space for efficient generation of the static magnetic field. Gradient, RF coil, and possibly the RF shielding seem to have been manufactured cylindrically.

U.S. Pat. No. 6,154,110 discloses a gradient coil system for open MRI magnets in which the gradient coils and the shielding coils are discontinued in a central region. RF shielding cannot be mounted in that same region as otherwise the open system would be closed by the RF shielding. In principle, this is a modification of biplanar gradient coil systems.

U.S. Pat. No. 5,600,245 discloses local gradient coil systems which surround the RF coil and leave an opening free in the region of the RF coil. However, these gradient coils are not actively shielded coils and can only function in conjunction with a main gradient coil and are only used to strengthen the gradient field locally.

U.S. Pat. No. 5,406,204 discloses a gradient coil system that contains RF shielding, which in certain embodiments, is disposed on different radii. The turns of the Z-gradient coil in one embodiment are installed in grooves of a former. The RF shielding is either installed on the surface of the former and in the grooves, outside the Z gradient coil, or both in the grooves and outside the Z gradient coil.

The depth of the grooves more or less corresponds to the thickness of the Z-gradient turns. It is pointed out that the outside surface of the RF shielding, together with the outside surface of the Z gradient turns, should constitute a largely even surface for accommodating the X- and Y-gradient turns.

Compared with the large diameters of the gradient coil system (60-90 mm), the thickness of the gradient turns can be considered negligible. This can be seen, in particular, in FIGS. 1 to 3 of U.S. Pat. No. 5,406,204: The illustrated graduation of the RF shielding in the grooves of the Z-gradient turns extends only in the range of approx. 0.5 to 1% of its radius. Due to this slight variation of the radius, it is explicitly explained that the grooves are irrelevant to the functionality of the invention and that the Z-gradient could be laminated onto a continuous RF shielding of constant radius without any substantial loss of performance. It seems that the RF shielding follows the shape of the grooves for manufacturing reasons rather than for performance reasons.

The document does not clearly state how the electrical connections between the individual turns of the Z gradient coil are implemented. However, it is stated that the X-, Y-, and Z-gradient coils are preferably designed according to patent application Ser. No. 07/942,521. This is the application on which the published application U.S. Pat. No. 5,296,810 cited in the introduction is based, in which a series connection of the turns for a Z-gradient is also shown to pass through the central region. It can therefore be assumed that in U.S. Pat. No. 5,406,204, electrical conductors exist across the entire length of the gradient coil system, on the radii of the main and shielding coils of the X-, Y-, and Z-gradient coils. Because the X- and Y-gradient coils are bonded onto the Z-gradient coil, it can be assumed that, in an embodiment with grooves, a coaxial groove must also exist, which forms the electrical connection between the two halves of the main gradient coil.

Modern NMR probes are usually manufactured with actively shielded gradient coil systems for generating pulses field gradients. Unlike sensors for magnetic resonance imaging methods (=MRI), most of these gradient coil systems are only uniaxial gradient coil systems, in particular, Z-gradients, in which the most uniform possible gradient of the magnetic field is applied along the z-direction, wherein the z-direction is defined by the direction of the static magnetic field. The effect of this gradient field on a spin I is a rotation about the z-axis through an angle $\gamma_I Gz$, wherein G is the gradient amplitude and $\gamma_I$ is the gyromagnetic ratio of the spin I. By applying a field gradient, a phase factor of the magnetization encoded along the gradient axis can be induced. In rare cases, gradient coil systems for generating multiple gradient fields are also used, in particular X-, Y-, Z-gradient fields, as are commonly used for MRI.

In nuclear magnetic resonance spectroscopy, it is usual to manufacture probes with integrated pulsed field gradient coils. As a rule, both the probes and the gradient coil systems have a cylindrical and/or hollow cylindrical shape, wherein in particular circularly cylindrical variants are used. These gradient coil systems are usually mounted on (circularly) cylindrical substrates and their conductors substantially occupy the entire lateral surface of the cylinder. In rarer cases and, in particular, for very strong gradient systems that require liquid cooling, the gradient systems are separated from the probes.

There are various manufacturing methods for gradient coil systems: Either they are wound from wire, wherein the wires are usually fixed inside grooves on the formers, or they are cut from, usually metallic, tubes, foils, or conductively coated formers, or manufactured on flexible printed-circuit boards or metal sheets or foils and subsequently mounted on formers.

The gradient turns can be manufactured by two different methods: by the so-called "lane change winding" or "spiral winding" methods. To simplify matters, the following discussion will be limited to Z-gradient coil systems, but applies in the widest sense also to all other gradient coil systems.

In the case of a Z-gradient coil system, in "lane changing" the turns are always located on a z position with the exception of a small section. In the small section, the transition from one z position to the next is executed. In "spiral winding," the z position is continuously occupied. In particular, wire gradients are usually executed as "lane change windings" because the spiral-shaped grooves cannot be manufactured with high precision or can only be manufactured with high precision with great difficulty. Due to the simpler calculation of the gradient design, however, gradient types manufactured in a different way are usually also manufactured as "lane change windings."

In order to manufacture a Z-gradient field, a main gradient coil is required, which is usually symmetrical with the xy-plane. To generate the gradient field, however, the direction of rotation of the current must be opposite in the two half spaces. Usually, the two gradient halves are connected in series by means of an electrical connection through the center, wherein this connection is laid on the same radius as the actual gradient turns.

For most NMR applications, actively shielded Z-gradient coil systems are used, wherein due to the necessarily short gradient recovery times, special attention must be paid to shielding the gradients to the outside and their interaction with the magnet and shim system, and with the RF coil systems inside. Actively shielded gradient coil systems usually consist of at least one main gradient coil and one shielding coil each, wherein the shielding coil fully circumferentially surrounds the main gradient coil. In particular, the shielding coils are usually longer than the main gradient coils. Because, for technical reasons, mostly only the lateral surfaces of the cylinder and not the cylinder end faces of the gradient coils are occupied, the missing end faces can be partially compensated for by extending the shielding coils. Moreover, parts of the axial shielding are commonly designed to be on the lateral cylinder surface of the main gradient coil.

Like for MRI, in NMR spectroscopy, the strongest and most efficient field gradients possible are required. In particular, the second point makes it necessary that the radial distance between the main gradient coil and the shielding coil are as large as possible. Because, however, the outer dimensions are determined by the bore of the magnet system, this can only be achieved by reducing the radius of the main gradient coil with respect to the fixed outer radius of the shielding coil.

An NMR probe is not primarily characterized by the gradient coil system that it contains because it is, in particular, designed to transmit and receive RF signals. This is performed with RF coil or resonator systems, which are tuned to the resonance frequencies of the nuclear spins to be measured in a given static magnetic field. There is therefore a lower limit for reducing the radius of the main gradient coils, which is defined by internal volume required for the efficient operation of the RF coil system.

There are basically two possible ways of combining RF coils and gradient coil systems in a NMR probe: Either both systems share the same space, i.e. they are not electromagnetically separated from each other, or the available space is divided into a region for the gradient coil system (gradient region) and a region for the RF system (RF region). In the latter case, an RF shield is placed between the coils and the gradient coil system.

The advantages and disadvantages of the two concepts are as follows: The volume available to an RF system is either not at all or only marginally restricted by a non-shielded gradient coil system as compared with a NMR probe without a gradient coil system. An inserted RF shield substantially reduces the performance of the RF system in some cases because shielding currents have to flow on the RF shield, which, on the one hand, have a dissipative effect and thus impair the Q-factor of the RF system and, on the other hand, generate a field that is opposed to the RF magnetic field and thus reduce the magnetic field amplitude generated per unit current in the measurement volume. Thus, the sensitivity of a NMR probe with RF shielding is reduced as compared with a probe without RF shielding.

However, since a non-RF-shielded gradient coil system in the radio frequency range has a wide spectrum of Eigen-resonances, which, in particular in the case of triple axis gradients, can couple, in some cases massively, with the RF coil system, the use of gradient coil systems without RF shielding is usually very complex or even impossible. Coupling between the Eigen-modes of the gradient and RF coil systems can in some cases cause considerably higher losses in the Q-factor and magnetic field amplitude per unit current than corresponding RF shield would generate.

To avoid this dilemma, the largest possible radii are selected for the gradient coil systems to keep losses resulting from RF shielding as low as possible. However, this results in a lower efficiency of the gradient coil system, which must be compensated for by higher currents and/or higher inductance and higher dissipation during operation.

The object of this invention is therefore to improve an actively shielded gradient coil system of the type described in the introduction by the simplest technical means possible so that the space available in the NMR probe can be divided into an RF region and a gradient region by an RF shield, wherein the volume of the RF region is maximized without loss of performance of the gradient coil system.

SUMMARY OF THE INVENTION

According to the invention, this object is fully achieved in a manner that is surprisingly simple but very effective, in that no electrical conductor elements of the gradient coil system are present in a hollow cylindrical section along the axial length L1, symmetrically with respect to the center of the measurement volume in a radius range between a minimum inner radius $R1\text{gradient}_{in}^{min}$ of the main gradient coil and $R1\text{shield}_{in}^{min}$, and that a passive RF shield is provided that is constructed from at least three electrically interconnected partial sections, of which two partial sections are disposed around the z-axis with a maximum outer radius $R1\text{hf}_{out}^{max}$, while, between these two partial sections, a third partial section with an axial length L2 and a minimum inner radius $R2\text{hf}_{in}^{min}$ as well as a maximum outer radius $R2\text{hf}_{out}^{max}$ is disposed around the z-axis, wherein the following applies: $R1\text{hf}_{out}^{max} < R1\text{gradient}_{in}^{min}$ and $R1\text{gradient}_{out}^{max} < R2\text{hf}_{in}^{min} < R2\text{hf}_{out}^{max}$ and $L2 < L1$.

In particular when using actively shielded Z-gradient coil systems, it is not absolutely necessary to occupy the full cylinder lateral surface or lateral surfaces on various radii across the entire z-range, as is usual for gradient coil systems in the prior art. The highest current densities have to be produced in the region of the reversal points of the gradient field, which, as a rule of thumb, must be located outside the range of the RF coil systems in order to be able to ensure a sufficient length of the gradient field across the active range of the NMR system. Additional turns may be necessary in the axial region in which the RF coil systems are located, in order to achieve better linearity of the Z-gradient field along the z-axis, wherein it is possible to implement part of the linearization with turns of the gradient shielding coil to the detriment of the shielding effect. Moreover, the additional turns required for linearization can be laid on a radius other than that of the main gradient coil.

Furthermore, it is sufficient for the remaining dimensions of the nuclear spin resonance spectroscopy to add a single pair of gradient coils to the pair of main gradient coils in order to achieve sufficient linearity for the Z-gradients over the measurement volume.

In addition to the usual goals of optimizing a gradient coil system for minimum inductance, maximum efficiency, linearity across a specific volume, shielding towards the outside, and recovery characteristics for a defined inner and outer diameter, volumes are prescribed that must be free of conductors. To keep the central region free of electrical conductors, the main gradient coil can be constructed as two or more separate partial coil systems. The incoming electrical supply cables to each of the partial coil systems are guided axially in the intermediate space between the main gradient coils and the shielding coil to the closer end of the gradient without crossing the central area. Now all partial coil systems of the gradient including the shielding coil(s) can be connected in series.

An inventive gradient coil system thus has a cylindrical section in a central region, which contains no conductor elements of the gradient coil system and has a maximum outer radius that is larger than the minimum inner radius of the conductor elements of the main gradient coil. Besides the actual gradient turns, it also contains the incoming supply and connection wires between the individual turns of the gradient coils. In particular, the outer radius of this cylindrical section is only insubstantially smaller or equal in size to the minimum inner radius of the shielding coil in this axial range.

This free space in the center of the gradient coil system can now be used to insert a passive RF shield, whose radius R2 in a central region becomes larger over the length L2 than its radius R1 in the outer regions (in particular in the region of the highest current density of the main gradient partial coil systems). To achieve this, the RF shield is constructed from at least three partial sections, which are electrically interconnected. In this context, electrical connection either means conductive connection or electromagnetic connection. Two conductor elements are considered to be electromagnetically connected if they are substantially electromagnetically coupled, which results, in particular, from capacitive or inductive coupling. It can be achieved by discrete or distributed elements having a capacitive and/or inductive effect. Distributed capacitive elements can be implemented, for example, as overlapping electrical conductors separated by dielectric layers for insulation.

Because at least one transmit and/or receive coil system is mounted in the central region of an NMR probe, the volume available for the latter is less limited by the inventive RF shield than in the prior art. For comparable performance of the gradient coil system, this results in higher performance for the transmit and/or receive coil system compared to an NMR probe according to the prior art.

In particular, the required pulse angles can be achieved during transmission with low pulse powers, which reduces the thermal effects. Furthermore, the sensitivity and thus the signal-to-noise ratio of the probe can be improved during reception.

The preferred embodiments and further embodiments of the invention with their working principles and special advantages are described below:

A particularly preferred embodiment of the inventive gradient coil system is characterized in that the following applies:
$R2hf_{out}^{max} < R1shield_{in}^{min}$.

This means that the shielding coil of the gradient coil system can be manufactured from a single piece, e.g., on a single former. This simplifies installation and alignment of the partial coil system of the main gradient coil with the shielding coil during manufacture.

Special advantages are also provided by an embodiment of the inventive gradient coil system, where:
$R2hf_{in}^{min} \geq 1.1 \cdot R1gradient_{out}^{max}$ and $R2hf_{out}^{max} \geq 0.8 \cdot R1shield_{in}^{min}$. With these dimensions, a significant increase in the performance of the transmit and/or receive coil system can be achieved.

In a further preferred embodiment, the following applies: $R2hf_{in}^{min} \geq R1gradient_{out}^{max} + 3$ mm and $R2hf_{out}^{max} \geq R1shield_{in}^{min} - 3$ mm. For the usual dimensions of the gradient coil system of an NMR probe with R2 approximately in the range 33 mm<R2<40 mm and R1 approximately in the range 18 mm<R1<25 mm, a noticeable increase in the performance of the transmit and/or receive coil system results from these dimensions as compared with an NMR probe according to the prior art.

One class of embodiments of the inventive gradient coil system is characterized in that electrical conductor sections wound around the z-axis are constructed from wires with a preferably round cross section. This is particularly simple to manufacture, e.g. by providing grooves in a substrate, in which wires are wound. Wires with a round cross section are even easier to mount than wires with any, in particular, with a square cross-section. Wires with a rectangular cross section optimize the current density per unit volume in the design as compared with round wires.

In an alternative class of embodiments, the electrical conductor sections wound around the z-axis are constructed from strip conductors. By strip conductors, wires are meant whose cross section has a width-to-height ratio that substantially deviates from 1, in particular, which has a height-to-width or width-to-height ratio that is greater than 1.5. Conductors with a width-to-height ratio greater than 2 are especially preferred. Strip conductors for the given radial dimension can minimize the electrical resistance of the gradient system or permit a smaller conductor spacing in the axial direction for the given electrical resistance.

A further alternative class of embodiments is characterized in that the electrical conductor sections wound around the z-axis are constructed from an electrically conductive layer of coated dielectric substrates. The precise and, at the same time, low-cost manufacture of gradient coil systems is possible by means of structuring (e.g. laser structuring, but also we chemical methods) of substrates coated with electrically conductive layers. In this way, manual effort can be minimized and reproducibility maximized. Suitable substrates are ceramic materials, plastics, types of glass, and ground nnonocrystals. If a substrate material with high thermal conductivity (e.g. aluminum nitrite, aluminum oxide, silicon or silicon carbide in the form of ceramics or nnonocrystals) is used, the substrate can, in addition to performing the function of mechanical positioning and stabilization of the electrical conductors, also effect heat transfer to cool them. This is, in particular, advantageous with cryogenically cooled gradient coil systems.

Embodiments of the inventive gradient coil system are also preferred where at least two of the pairs of axially spaced cylindrical partial coil systems of the main gradient coil have differing minimum inner radii $R1gradient_{in}^{min}$, $R2gradient_{in}^{min}$, $R3gradient_{in}^{min}$. With these embodiments, for example, coils can be inserted to linearize the gradient, which only minimally reduce the space available for the RF region if the RF shielding follows the profile of the conductor of the gradient coil system.

In further advantageous embodiments, at least two partial sections of the passive RF shielding have differing minimum inner radii $R1hf_{in}^{min}$, $R2hf_{in}^{min}$, $R3hf_{in}^{min}$, $R4hf_{in}^{min}$. This makes it possible to maximize the RF region if a gradient with at least two pairs of axially spaced cylindrical partial coil systems with differing minimum inner radii is used. Moreover, this also makes it possible to implement a "recess" of the RF shielding only in the region of the conductors of a partial coil system of the main gradient coil. This maximizes the RF region and thus the performance of the NMR transmit and/or receive coil systems.

Furthermore, embodiments are also preferred in which at least one of the cylindrical partial coil systems is constructed from multiple electrical conductor sections wound over one another in the radial direction. Conductors wound over one another means conductors that are mounted on multiple radii at approximately the same z-position. This makes it possible to design higher current densities in one z-position for a constant conductor width. In this way, the resistance of the gradient coils can be reduced as compared with designs that use locally reduced conductor widths and the design is simplified. Compared with "distributed" occupancy by conductors, the space occupied by the conductors of the main gradient coil, which is no longer available for the RF region, is also minimized.

Equally advantageous is a class of embodiments, which are characterized in that the cylindrical partial coil systems of the main gradient coil as well as the at least one active shielding coil, are completely enclosed by the passive RF shield except for an incoming supply cable opening. In this way, on one hand, the electromagnetic coupling between the gradient coils and the transmit and/or receive coil systems can be minimized or reduced to zero, on the other hand, any detectable NMR signals from materials of the gradients (e.g. $^1$H or $^{13}$C signals from insulation of the electrical conductors, adhesives, substrate materials, etc.) can be minimized or reduced to zero.

This embodiment of the inventive gradient coil system can be further developed by enclosing the radial inner surfaces and the axial end faces of the cylindrical partial coil systems of the main gradient coil as well as the radial outer surfaces and the axial end faces of the at least one active shielding coil by the passive RF shield. In this way, the gradient coil system is completely surrounded by the RF shielding so that the coupling and background signal can be reduced or excluded.

An alternative class of embodiments is characterized in that the passive RF shield is shaped such that it surrounds a RF-tight spatial region from which RF radiation cannot penetrate to the outside. In this embodiment, the RF region is strictly delimited so that couplings with the outside space can be efficiently minimized and no NMR background signal can be received from the outside space.

The two classes of embodiment described above can be advantageously further developed so that RF impenetrability of the passive RF shield can be achieved with capacitive overlapping of elements of the passive RF shield and/or soldering and/or by compression and/or by gluing with electrically conductive adhesive. This enables low-cost manufacture of RF-impenetrable stepped passive RF shielding from several parts.

Gradient coil system according to any one of the previous claims, characterized in that the passive RF shield (3) is mounted on a substrate, in particular, by vacuum deposition and/or sputtering and/or CVD and/or by galvanic coating and/or printing and/or painting and/or gluing. This makes it possible to efficiently introduce an RF shield onto the inner side and/or outer side of a substrate material in one manufacturing step. Furthermore, the electrically conductive layer mounted in this way can, in a further step, be simply and precisely structured in a pattern, minimizing shielding currents during gradient switching.

A further preferred embodiment is characterized in that at least two of the electrically interconnected partial sections are disposed in a cylindrically symmetric manner around the z-axis with a maximum outer radius $R1hf_{out}^{max}$, wherein between these two partial sections, a third partial section with an axial length L2 and a minimum inner radius $R2hf_{in}^{min}$, as well as a maximum outer radius $R2hf_{out}^{max}$ is disposed around the z-axis, and that, between the third partial section and the two other partial sections, in each case a transitional section, in particular, in the form of a conical element, is disposed, which interconnects the partial sections disposed on different radii along an axial length L8. This embodiment is particularly suitable if the passive RF shielding is mounted on a substrate using a coating method, as no surfaces perpendicular to the cylinder axis or sharp edges have to be coated or structured.

The scope of this invention finally also includes an MR spectrometer with a gradient coil system with the inventive modifications described above, which is characterized in that an RF transmit and/or receive coil system is provided that is disposed inside the radius $R2hf_{in}^{min}$ along an axial length L3<L2 symmetrically with respect to the center of the measurement volume. If the cutout with an enlarged radius of the passive RF shielding has a longer length than the RF transmit and/or receive coil system, the performance of the latter can be further improved.

Further advantages result from the description and the drawing. The drawings do not necessarily show the various characteristics true to scale. Moreover, according to the invention, the features stated above and further below can be used singly or together in any combination. The embodiments shown and described are not intended to be an exhaustive list, rather are examples to explain the invention.

DESCRIPTION OF THE PREFERRED EMBODIMENT

Figure 1:
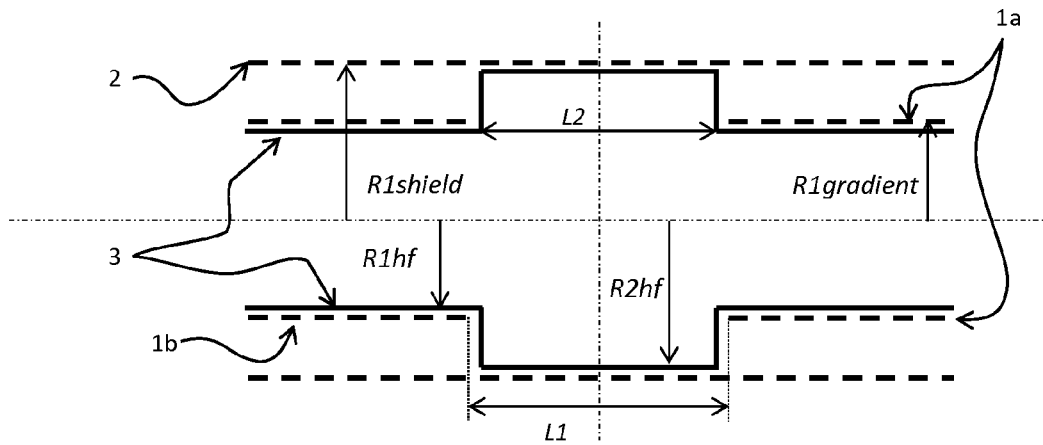
FIG. 1 a schematic cross section through a first, particularly simply constructed embodiment of the inventive actively shielded cylindrical gradient coil system.

The following detailed description presents examples that disclose specific details and are intended to explain, not to restrict, in order to provide a more in-depth understanding of the present teachings. For a person skilled in the art who has read this disclosure, it is, however, obvious that other examples according to the present teachings, which deviate from the specific details disclosed in this document, are protected by the attached claims. Moreover, descriptions of devices and methods known from the prior art may have been omitted for reasons of clarity. Such methods and equipment obviously lie within the scope of protection of the present teachings.

The terminology used herein exclusively serves the purpose of describing certain examples and is not intended to restrict. The defined expressions are additional to the technical and scientific meanings of the defined expressions as they are usually understood and accepted in the technical field of the present teachings.

The expressions "one, a and the" cover both singular and plural forms unless the context unambiguously states the contrary. Thus, for example "a device" covers one device and/or a plurality of devices.

The expressions "substantial" or "substantially" used in the description and in the attached claims signify "within acceptable limits and degrees."

The expressions "approximate" or "approximately" mean "within acceptable limits or an amount as understood by an average person skilled in the art." For example, "approximately equal" means that an average person skilled in the art considers the elements that are being compared to be identical.

The expression "in particular" merely emphasizes a subset of a set without explicitly restricting the total population of the set. For example, the set "cylinders, in particular circular cylinders," comprises the set of all cylinders of any cross-sectional shape and merely emphasizes those with a circular cross-sectional shape as being especially suitable.

An inventive actively shielded gradient coil system for use in an MR spectrometer with one main field magnet, which generates a main magnet field aligned in the direction of a z-axis, is disposed cylindrically around the z-axis and comprises one main gradient coil, which is constructed from at least two cylindrical partial coil systems, at least one cylindrical shielding coil, and at least one passive RF shield, wherein the at least two partial coil systems of the main gradient coil are constructed from electrical conductors on a radius R1gradient, and are spaced in the z-direction along an axial length L1, and the at least one shielding coil is constructed from electrical conductors on a radius R1shield.

In many embodiments, in particular those with electrical conductor elements made of wire, the radial extent of the main gradient coil and the shielding coil is so large that the difference between the minimum inner diameter and the maximum outer diameter can no longer be considered approximately equal. For that reason, in particular, for the embodiments with non-negligible radial dimensions, a minimum inner radius $R1gradient_{in}^{min}$ and $R1shield_{in}^{min}$ as well as a maximum outer radius $R1gradient_{out}^{max}$ and $R1shield_{out}^{max}$ are assigned respectively in each case. In the case of circularly cylindrical gradient coil systems, in particular, the minimum inner radius is equal to the inner radius and the maximum outer radius is equal to the outer radius. For embodiments, in particular circularly cylindrical ones, with approximately the same inner and outer radii of the partial coils, $R1gradient_{in}^{min}=R1gradient_{out}^{max}=R1gradient$.

The following conditions apply here:

$R1gradient_{out}^{max}<R1shield_{in}^{min}$, i.e. the main gradient coil can be constituted inside the shielding coil. This facilitates both simple installation during manufacturing as well manufacturing on a single former for the shielding coil and the gradient coil in which the conductor elements are mounted on the inner side and the outer side. Technically, this condition is necessary for separation of the functionality into field generation in an inside space, in particular, in the measuring volume, and active shielding of the gradient field in an outside space, in particular, outside the NMR probe.

Moreover, $R1shield_{out}^{max}$ is determined by the maximum possible dimensions of the gradient coil system that can still be installed in the NMR probe or in the shim system of the MR spectrometer. $R1gradient_{in}^{min}$ is determined by the requirements for performance of the gradient coil system and the dimensions and performance of the transmit and/or receive coil system.

The gradient coil system furthermore consists of at least one passive RF shielding system, which is cylindrical in sections, its electrically conductive elements being located within at least two minimum inner radii $Rihf_{in}^{min}$ and two maximum outer radii $Rihf_{out}^{max}$, wherein i is a natural number greater than or equal to two. Analogously with the radii of the gradient coils, if the inner and outer radii are approximately equal, the latter will be considered $Rihf_{in}^{min}=Rihf_{out}^{max}=Rihf$, which is, in particular achieved by thin, circularly cylindrical RF shields.

The RF shield is composed of at least three partial sections, wherein two of these partial sections have the radius R1hf and, between these two, a third partial section with an axial length of L2 is inserted symmetrically with respect to the center of the measuring volume along radius R2hf.

The following conditions apply for radii of the passive RF shield: $R1hf_{out}^{max}<R2hf_{in}^{min}$, $R1hf_{out}^{max}<R1gradient_{in}^{min}$ and $R1gradient_{out}^{max}<R2hf_{in}^{min}$. Furthermore, the axial dimensions are L2<L1. This results in an actively shielded gradient coil system with a passive RF shielding, which in a central region has an outward extending recess. Because at least one transmit and/or receive coil system is located in this central region of the NMR probe, the performance of the latter is improved by the increased size of the volume available as compared with the NMR probes of the prior art with cylindrical RF shield on the radius R1hf.

An embodiment is especially preferred that consists of one main gradient coil comprising exactly two partial coil systems and one single shielding coil, wherein the passive RF shield has as small a radial distance as possible to the shielding coil in the central area and as small radial distance as possible to the gradient coils in the edge areas.

For this embodiment, the condition $R2hf_{out}^{max}<R1shield_{in}^{min}$ applies in addition to the conditions stated above. This embodiment can be implemented technically extremely easily and makes it possible to provide a large volume for the RF coil system without restricting positioning of the conductor element of the shielding coil. In this way, efficient shielding of the gradient fields toward the outside can be ensured. If the shielding coil is mounted on a former and the latter has a small wall thickness, there is only a slight loss of performance of the transmit and/or receive coil system in this embodiment. It is shown schematically as a cross section in FIG. 1.

In particular, such a gradient coil system can preferably be manufactured from the following components:

1. From four components comprising an RF shielding on a substrate, two partial coil systems of the main gradient coil, each on a tube-shaped substrate, and one shielding coil on another tube-shaped substrate. This manufacturing method can be used for all common methods of manufacturing gradient systems. In particular, it is suitable for gradients wound from wire, but also for electrically conductively coated formers. If the gradient coils are manufactured from cut metal tubes, the formers can be omitted at least for part of the elements.
2. From three components each comprising one or more partial coil systems of the main gradient coil on the inner side and half of the shielding coil (cut through the xy-plane) on the outer side, as well as RF shield on a substrate. Here, it should be noted that manufacturing a shielding coil from two halves can be seen as substantially identical to manufacturing on a single cylindrical substrate, if the two halves touch to a substantial degree in the central section. This manufacturing method reduces the degrees of freedom of positioning of the components and can thus minimize waste if the manufacturing technique can ensure correct positioning of the conductor element on both substrates.
3. The gradient coil system can be manufactured on the inner and outer sides of a single substrate into which the RF shield is inserted. In this case, the RF shield is usually assembled from individual parts or mounted on an insulation layer inside the gradient coil. This manufacturing method is, in particular, suitable for electrically conductively coated formers and, with manufacturing by machine, results in a high yield of gradients without complex positioning of the main gradient coil with respect to the shielding coil.
4. Another possibility is to manufacture the gradient coil system on the inner and outer side of a "half-shell shaped" substrate cut along the longitudinal axis. Here, the design of the gradient system can, in particular, be designed in such a way that no or only very few electrically conductive connections between the "half shells" are required. This can be achieved, for example, by having the current exchanged multiple times between the main gradient coil and the shielding coil across the cut edge. The RF shielding can be manufactured on a third substrate, which is inserted in both half shells or which is mounted on an insulation layer inside the half shells.

Other manufacturing methods consisting of more elements, in particular, for the RF shield, can also have advantages under certain circumstances, in particular, if the RF shield is not manufactured from a continuous, thin, electrically conductive layer, but from sections with capacitive coupling between adjacent elements.

In another preferred embodiment, the outer radius of the RF shield can also be larger than the inner radius of the active shielding coil in a central section of the length L2, that is, $R2hf_{out}^{max} \geq R1shield_{in}^{min}$. This is possible if the design of the gradient does not include a central region of the length L6, in which the main gradient coil nor the shielding coils have conductor elements. In this case, the volume for the transmit and/or receive coil systems is maximized. However, usually, the efficiency of the active gradient shielding is slightly reduced, so that when the gradient field is switched quickly, more eddy currents are induced in the electrically conductive structures having radii greater than $R1shield_{out}^{max}$. This must be counteracted by using suitable materials with a high electrical resistance and/or non-conductive materials near the gradient coil system or by adapting the design of the gradient, which generates eddy currents that affect the measuring volume less. As a rule, the following still applies: $R2hf_{out}^{max} = R1shield_{out}^{max}$.

Figure 2:
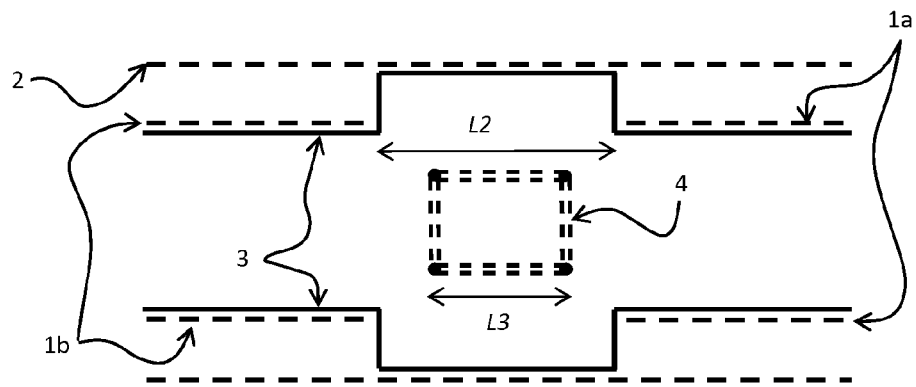
FIG. 2 an embodiment of the inventive gradient coil system containing a transmit and/or receive coil system.

Furthermore, an embodiment is especially preferred in which the length L2 is greater than the length L3 of at least one transmit and/or receive coil system. This permits the lowest possible performance losses by RF shielding while simultaneously achieving good efficiency of the gradient coil system. FIG. 2 schematically shows such a gradient coil system in its simplest form. An NMR probe usually comprises more than one transmit and/or receive coil system. In this case, the length L3 refers to the magnetic length of one of these coil systems. There are various definitions for the magnetic length of transmit and/or receive coil systems, which, however, within the scope of this invention can be interpreted as approximately the same values. One of these definitions for magnetic length is the half-value length of the RF magnetic field on the z-axis.

In another embodiment, the partial coil systems of the main gradient coil are manufactured on more than one radius and the RF shield is manufactured on more than two radii. This has the advantage of providing more flexibility for the design of the gradient, improving the linearity and shielding of the gradient and at the same time further increasing the volume available for the RF region for the given specifications of the gradient coil system.

Figure 3:
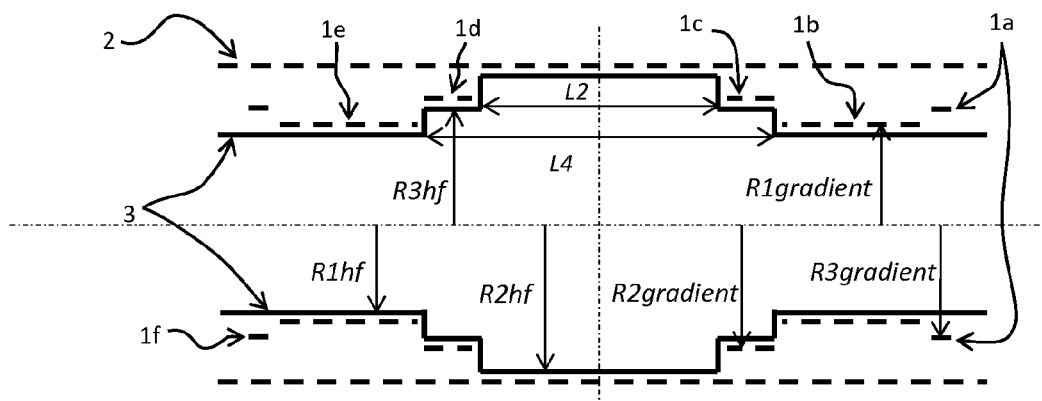
FIG. 3 an embodiment with a main gradient coil comprising three pairs of partial coil systems on different radii and a passive RF shield with three partial sections on different radii.

FIG. 3 schematically shows a gradient coil system in which the RF shielding has an inner radius $R2hf_{in}^{min}$ over the length L2. Along two sections of $L2/2 \leq |z| \leq L4/2$ that are symmetrical with the center of the measuring volume, it has a radius R3hf, where $R3hf_{out}^{max} < R2hf_{in}^{min}$. Along the remaining length, the RF shielding has a radius R1hf, wherein in this example $R1hf_{out}^{max} < R3hf_{in}^{min}$ applies. In principle, further graduations of the RF shielding are possible. These do not need to be disposed symmetrically with respect to the magnetic center of the probe either.

In a further preferred embodiment, the partial coil systems of the main gradient coil occupy a smaller area. This further maximizes the volume for the RF region. This reduced occupation of the area can, in particular, be achieved if multiple layers of conductors are radially stacked one on top of the other. This is, in particular, advantageous for gradients wound from wire because it is technically simple to solve by manufacturing grooves in a substrate for accommodating gradient wires and the gradient is wound densely packed in these grooves. Alternatively, this can be achieved using multilayer PCBs or by nesting multiple layers of tubes one inside the other. In this case, each radius occupied by a conductor must be viewed as an independent gradient coil on radius Rigradient, wherein i is a natural number (positive integer). The z-positions of different partial coil systems can therefore also overlap.

Figure 4:
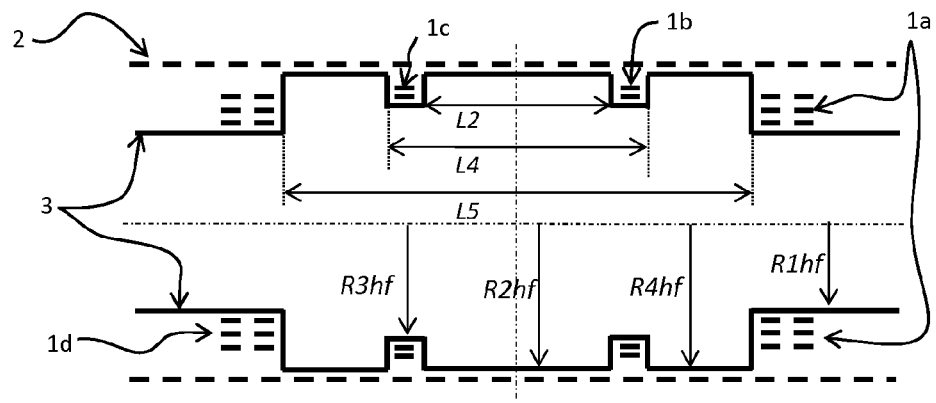
FIG. 4 a further inventive gradient coil system, in which the partial coil systems of the main gradient coil are each manufactured from multiple layers of conductors and the RF shield defines recesses in the region of the conductors.

In FIG. 4, such a gradient coil system is represented schematically in cross section, wherein in this specific embodiment the RF shielding has radius R2hf in an interval $-L2/2 \leq z \leq L2/2$, and radius R3hf in two further intervals $L2/2 < |z| < L4/2$, radius R4hf in intervals $L4/2 \leq |z| \leq L5/2$, and radius R1hf over the remaining length. In FIG. 4, R2hf=R4hf. This does not necessarily have to apply and is merely used to illustrate an especially preferred variant. Generally, all radii can be different. Moreover, in FIG. 4, the axial extent of the various gradient coils at approximately the same z-position is shown to be of equal size. This does not have to be ensured generally, but is especially easy to implement, for example, for wire gradients when wires are wound in grooves. Another simple way of implementing a wire gradient is to wind the wires into a "sphere packing" so that each layer contains one wire less than the previous one and is offset by half of the wire diameter in z-direction.

For certain applications of NMR, not only the reduction of coupling between the transmit and/or receive coil system and the gradient coil system is relevant but also suppression of the NMR background signal, which is due to wire or conductor insulations, adhesives, or substrate material in the gradient. This background signal is generated by excitation and reception of NMR signals. In the best case, it results in a reproducibly altered baseline of the NMR spectra, which can be corrected numerically. This is the case, in particular, when the background signal is weak and the corresponding NMR lines are very broad. In the worst case, however, the background signal contains relatively strong narrow NMR lines that cannot be corrected. To avoid this background signal as completely as possible, it is advisable to disconnect the gradient coil system completely from the RF region. To achieve that, it may be necessary to enclose the gradient on the inner side, outer side, and at the end face using RF shielding. RF shielding can also be implemented in the region of the gradient supply cable in order to prevent coupling or reception of the background signal in this region. In this context, it must be noted that usually only components with an almost identical static magnetic field can contribute to the NMR background signals as otherwise the Larmor frequency of the nuclei of the background is shifted with respect to the spectrum to be measured to such an extent that it ends up outside the measurement frequencies because the static field of the main magnets exhibits a plateau which is substantially symmetrical with respect to the measuring range and having an amplitude dropping steeply outside that range.

Figure 5:
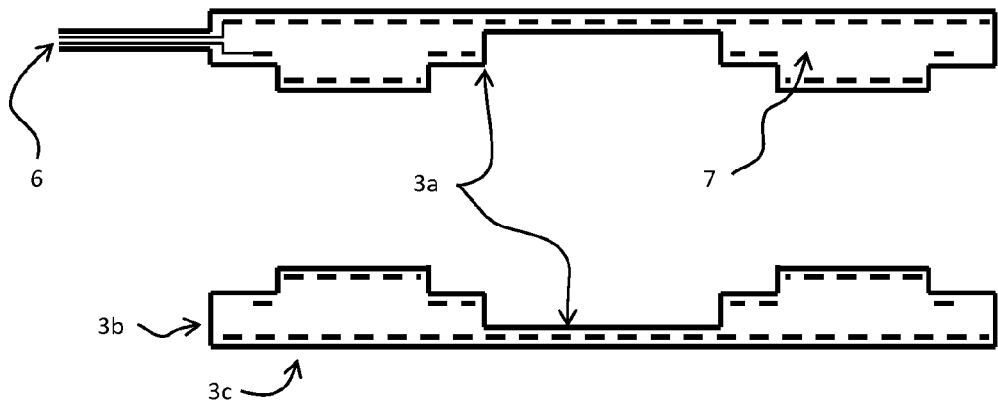
FIG. 5 an embodiment of the inventive gradient coil system, which is completely surrounded by the passive RF shielding.

FIG. 5 schematically illustrates a variant of this embodiment in which the gradient coil system is fully enclosed by an RF shield. Here, the RF shield consists of elements 3a on the inner side of the gradient coil system, elements 3b on the end faces, and elements 3c on the outer side of the gradient coil system, as well as an enclosure 6 of the gradient supply cables. The RF shield forms a sealed gradient region 7 into which essentially no RF radiation can penetrate as long as the RF shield achieves a sufficient level of attenuation of the RF radiation. This can be achieved particularly well by electrically closed RF shielding if the conductor thickness is larger than several skin depths at the relevant frequencies and temperatures. Alternatively, a structured RF shield can also be designed such that it has sufficient RF impenetrability against the relevant frequencies. However, structured shielding is usually not sufficiently impenetrable to RF that it fully prevents artifacts produced by the background signal.

End face elements and elements shaped to the lateral cylinder surface can, for example, be connected by capacitive overlapping, soldering, compression, gluing with conductive adhesive, etc. to keep RF impenetrability of the RF shielding to the required level.

Figure 6:
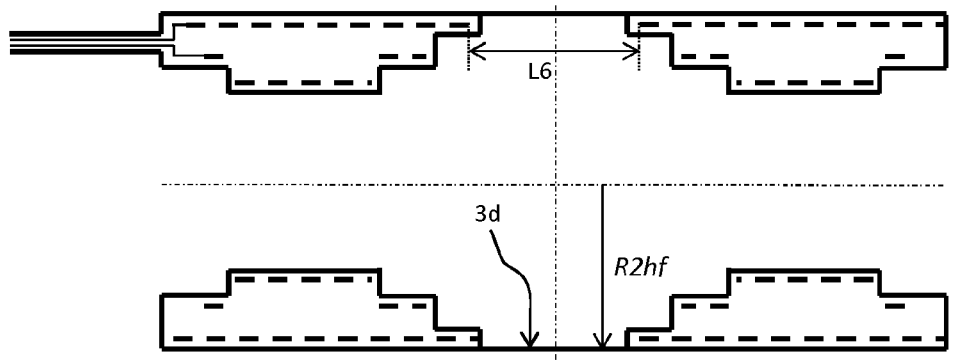
FIG. 6 an inventive gradient coil system, which is entirely surrounded by the passive RF shielding, wherein the gradient shielding coil consists of two spaced partial coil systems in a central region.

FIG. 6 shows an embodiment in which the RF shielding is implemented in such a way that for the central region of the RF shielding (3d) $R2hf_{out}^{max}$ $R1shield_{out}^{max}$ applies. As a result, the volume of the RF region relevant to the performance of the transmit and/or receive coil systems can be increased even further. To achieve this, the shielding coil must have a symmetrical region at its center of length L6, which contains no conductors. In this case, the radius $R2hf_{out}^{max}$ is identical to the radius of the RF shield of a NMR probe without an integrated gradient coil system or with a gradient coil system without RF shielding.

Figure 7:
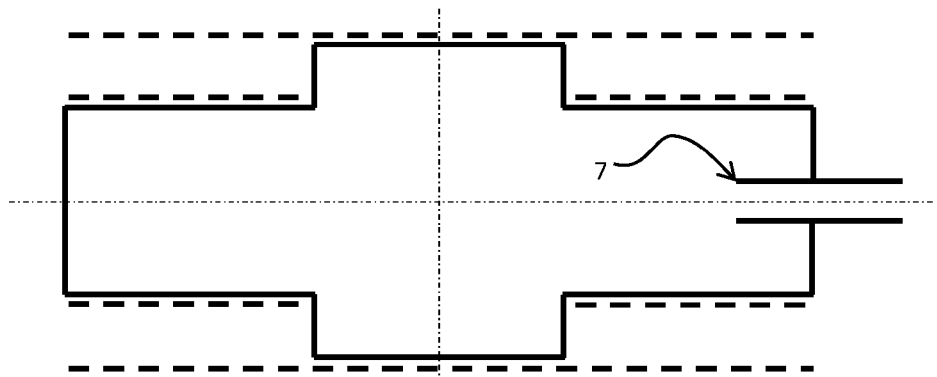
FIG. 7 an embodiment with an RF-impenetrably sealed RF region.
Figure 8A:
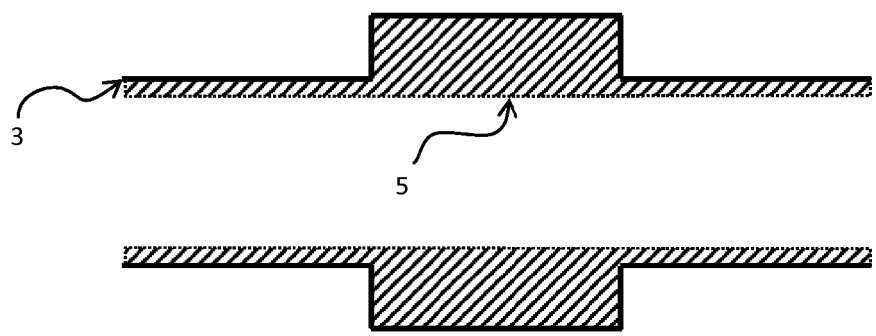
FIG. 8a RF shield for an inventive gradient coil system, which is mounted on the outer side of the substrate.
Figure 8B:
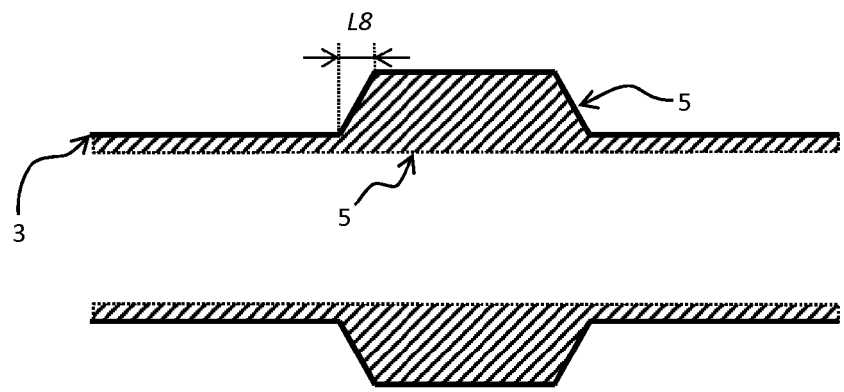
FIG. 8b RF shield, which is mounted on the outer side of a substrate, wherein the transition between the two radii of the RF screening is constituted as a cone.

In the above mentioned variants of RF shields, the material that generates the background signal is "packed in" by the RF shielding. As an alternative thereto, an RF-impenetrable RF-shield can be implemented inside the gradient system by sealing the RF-region towards the outside. This prevents, for example, NMR background signals resulting from materials outside the actual RF region from being received. I.e., the RF region is encapsulated in such a way that no signal can be received outside this region. For this reason, the end faces of the RF region must be as impenetrable as possible to RF. However, because a measuring sample usually has to be inserted into the probe, this can only be completely achieved on one side. The insertion opening can be closed, for example, using a waveguide, which is operated below its cutoff frequency and thus exhibits exponential attenuation for the RF waves. This is illustrated schematically in FIG. 7. Moreover, the RF supply cables must be inserted through the RF shielding in such a way that they cannot emit any radiation in the outside space.

In an especially preferred embodiment, the RF shield is mounted on a former (for example by vacuum deposition, sputtering, CVD, galvanic coating, gluing, clamping, printing, or painting). This has the advantage that no internal coating has to be carried out and the RF shield is merely mounted on the outer sides. This is technically considerably easier to implement. In addition, structuring of the RF shield on an outer lateral cylinder surface is also technically simpler. Structuring can improve the "recovery behavior" of the gradient coil system because the eddy currents induced in the RF shield are reduced due to electrical interruptions in the RF shield. Many different variants of patterned RF shields that can be adapted to the inventive geometry are mentioned in the literature. The inventive execution of the RF shield explicitly covers all concepts known from the prior art for implementing passive RF shielding.

Due to the typical dimensions in NMR applications, electrical connections between the individual sections of the RF shielding are considerably easier to implement on the outer side than on the inner side of the substrate. This is particularly the case for their electrically conductive connection, for example, by soldering when mounting on the outer side of the substrate. Likewise, RF shielding structured on a flexible printed circuit board (PCB) can be simply mounted from the outside onto a former, e.g. by gluing or clamping.

Moreover, the former can be manufactured from material with high thermal conductivity (aluminum oxide, aluminum nitride, silicon nitride, or silicon carbide in ceramic, polycrystalline form, or as a single crystal, e.g. sapphire) making it possible to cool the RF shield efficiently. This is necessary, in particular, for probes with cryogenically cooled RF coil systems, in order to keep the noise contribution of the RF shield as small as possible. Furthermore, this is also an advantage for gradients that have to operate with high currents because cooling can be performed during operation, e.g. by the coolant tubes embedded in the former or mounted on it. This way, the duty cycle and permissible maximum current of an inventive gradient system can be increased.

It is particularly easy to manufacture RF shields on a substrate if the transitions between the various radii of the RF shield are beveled. It is technically considerably easier to apply electrically conductive coatings on this type of former. The beveling can be conical; however, it can also contain geometries that are more complicated.

The design of the passive RF shield presented within the scope of this invention can be combined with the various implementation options for reducing eddy currents on RF shields according to the prior art. However, thin metallic layers that have few or no slots are especially preferred. "Thin" means a metallic layer where the thickness of the layer d is of the same magnitude as the electrical penetration depth (skin depth) $\delta$ in the relevant frequency range, that is, $0<d<10\delta$, but in particular $0<d\leq3\delta$.

For slotted shields, capacitive connections between the individual conductive elements are preferably implemented as capacitive overlaps across the slots. This minimizes the radial dimensions. Moreover, capacitive overlaps with small dielectric layer thickness are preferred because the remaining magnetic flux through the remaining gap is smaller than for capacitive connections with the same capacitance values but a larger distance between the conductive elements. In the case of larger RF shields, the capacitive connections can also be carried out using discrete capacitors, which permits greater flexibility in the selection of elements.

LIST OF REFERENCE SYMBOLS 1a-1f Electrical conductor sections of the partial coil systems of a main gradient coil
2; 2a-2c Active shielding coils
3 Passive RF shield
3a-3e Partial sections of the passive RF shield
4 RF transmit and/or receive coil system
z z-axis
Variables List
L1 Length of the axial spacing between the partial coil systems of the main gradient coil in which there are no conductor elements between $R1gradient_{in}^{min}$ and $R1shield_{in}^{min}$
L2 Axial length of the third partial section of the RF shield
L3 Axial length of the RF transmit and/or receive coil system
L4,5 Axial length of various regions of the RF shield
L6 Axial spacing between the two partial coil systems of the shielding coil
$R1gradient_{in}^{min}$ Minimum inner radius of the main gradient coil
$R1gradient_{out}^{max}$ Maximum outer radius of the main gradient coil
$R1shield_{in}^{min}$ Minimum inner radius of the shielding coil
$R1hf_{out}^{max}$ Maximum outer radius of the at least two partial sections of the RF shield
$R2hf_{in}^{min}$ Minimum inner radius of the third (central) partial section of the RF shield
$R2hf_{out}^{max}$ Maximum outer radius of the third (central) partial section of the RF shield
$R2gradient_{in}^{min}$ Minimum inner radius of a second partial coil system of the main gradient coil
$R3gradient_{in}^{min}$ Minimum inner radius of a third partial coil system of the main gradient coil
$R1hf_{in}^{min}$ (i∈ℕ) Minimum inner radii of the various partial sections of the RF shielding

LIST OF REFERENCES

[1] U.S. Pat. No. 5,296,810
[2] U.S. Pat. No. 4,733,189
[3] U.S. Pat. No. 7,109,712 B2
[4] U.S. Pat. No. 6,456,076 B1
[5] U.S. Pat. No. 5,512,828
[6] U.S. Pat. No. 5,939,882
[7] U.S. Pat. No. 6,933,723 B2
[8] U.S. Pat. No. 7,852,083 B2
[9] U.S. Pat. No. 7,057,391 B1
[10] U.S. Pat. No. 6,154,110
[11] U.S. Pat. No. 5,600,245
[12] U.S. Pat. No. 5,406,204

I claim:
1. An actively shielded, cylindrical gradient coil system for use in an MR (=magnetic resonance) spectrometer, the spectrometer having a main field magnet, which generates a main magnet field aligned in a direction of a z-axis, wherein, when current flows, the gradient coil system generates a Z-gradient field in a measurement volume through which the z-axis passes whose zero crossing is located at a center of the measurement volume, the gradient system comprising:
at least one main gradient coil, said main gradient coil being constructed from at least two cylindrical partial coil systems, axially spaced from one another in the z-direction by a length L1 and symmetrically with respect to the center of the measurement volume, axes of said cylindrical partial coil systems being collinear with the z-axis, wherein said cylindrical partial coil systems are at least partially constructed from electrical conductor sections wound with a maximum outer radius $R1gradient_{out}^{max}$ around the z-axis;
at least one active shielding coil, at least one of said at least one active shielding coil being constructed from electrical conductors on a minimum inner radius $R1shield_{in}^{min}$ around the z-axis, with $R1shield_{in}^{min} > R1gradient_{out}^{max}$, wherein the gradient coil system has no electrical conductor elements disposed in a hollow cylindrical section along said axial length L1, symmetrically with respect to the center of the measurement volume in a radius range between a minimum inner radius $R1gradient_{in}^{min}$ of the main gradient coil and $R1shield_{in}^{min}$; and
a passive RF shield, said passive RF shield being constructed from at least three electrically interconnected partial sections, of which two partial sections are disposed around the z-axis with a maximum outer radius $R1hf_{out}^{max}$, wherein a third partial section with an axial length L2, a minimum inner radius $R2hf_{in}^{min}$ and a maximum outer radius $R2hf_{out}^{max}$ is disposed around the z-axis between said two partial sections, wherein $R1hf_{out}^{max} < R1gradient_{in}^{min}$, $R1gradient_{out}^{max} < R2hf_{in}^{min} < R2hf_{out}^{max}$ and L2<L1.

2. The gradient coil system of claim 1, wherein $R2hf_{out}^{max} < R1shield_{in}^{min}$.

3. The gradient coil system of claim 1, wherein $R2hf_{in}^{min} \geq 1.1 \cdot R1gradient_{out}^{max}$ and $R2hf_{out}^{max} \geq 0.8 \cdot R1shield_{in}^{min}$.

4. The gradient coil system of claim 1, wherein $R2hf_{in}^{min} \geq R1gradient_{out}^{max} + 3$ mm and $R2hf_{out}^{max} \geq R1shield_{in}^{min} - 3$ mm.

5. The gradient coil system of claim 1, wherein electrical conductor sections wound around the z-axis are constructed from wire with a round cross section.

6. The gradient coil system of claim 1, wherein electrical conductor sections wound around the z-axis are constructed from strip conductors.

7. The gradient coil system of claim 1, wherein electrical conductor sections wound around the z-axis are constructed from electrically conductive layers coated on dielectric formers.

8. The gradient coil system of claim 1, wherein at least two pairs of said axially spaced cylindrical partial coil systems of said main gradient coil have differing minimum inner radii.

9. The gradient coil system of claim 1, wherein at least two partial sections of said passive RF shield have differing minimum inner radii.

10. The gradient coil system of claim 1, wherein at least one of said cylindrical partial coil systems is constructed from a plurality of electrical conductor sections stacked in a radial direction.

11. The gradient coil system of claim 1, wherein said cylindrical partial coil systems of said main gradient coil and at least one active shielding coil are completely enclosed by said passive RF shield with an exception of an incoming supply cable opening.

12. The gradient coil of claim 11, wherein radial inner surfaces and the axial end faces of said cylindrical partial coil systems of said main gradient coil as well as radial outer surfaces and axial end faces of said at least one active shielding coil are enclosed by said passive RF shield.

13. The gradient coil system of claim 1, wherein said passive RF shield is shaped to enclose a region of space that is impenetrable to RF radiation and from which RF radiation cannot escape.

14. The gradient coil system of claim 11, wherein an RF impenetrability of said passive RF shield is achieved by capacitive overlapping elements of said passive RF shield, by soldering, by compression and/or by gluing with electrically conductive adhesive.

15. The gradient coil systems of claim 1, wherein said passive RF shield is mounted on a substrate or is mounted on a substrate by vacuum deposition, sputtering, CVD, galvanic coating, printing, painting and/or gluing.

16. The gradient coil system of claim 1, wherein at least two of said electrically interconnected partial sections of said passive RF shield are disposed cylindrically symmetrically around the z-axis with a maximum outer radius $R1hf_{out}^{max}$, wherein a third partial section with an axial length L2 and a minimum inner radius $R2hf_{in}^{min}$ as well as a maximum outer radius $R2hf_{out}^{max}$ is disposed around the z-axis between those two partial sections and that, between said third partial section and each of those two other partial sections, a transitional section is disposed, which interconnects partial sections disposed on different radii along an axial length L8.

17. The gradient coil system of claim 16, wherein said transitional section comprises a conical element.

18. An MR spectrometer having the gradient coil system of claim 1, further comprising an RF transmit and/or receive coil system which is disposed inside said radius $R2hf_{in}^{min}$ along an axial length L3<L2 and symmetrically with respect to the center of the measurement volume.

* * * * *